US012606932B2

(12) United States Patent
Li et al.

(10) Patent No.: US 12,606,932 B2
(45) Date of Patent: Apr. 21, 2026

(54) GROWTH METHOD OF HIGH-TEMPERATURE PHASE LANTHANUM BOROSILICATE CRYSTAL AND USE

(71) Applicant: Fuzhou University, Fuzhou City (CN)

(72) Inventors: Lingyun Li, Fuzhou City (CN); Yi Shi, Fuzhou City (CN); Fazheng Huang, Fuzhou City (CN); Ziwei Zhou, Fuzhou City (CN); Xinxu Li, Fuzhou City (CN); Yan Yu, Fuzhou City (CN)

(73) Assignee: FUZHOU UNIVERSITY, Fuzhou City (CN)

( * ) Notice: Subject to any disclaimer, the term of this patent is extended or adjusted under 35 U.S.C. 154(b) by 995 days.

(21) Appl. No.: 17/826,221

(22) Filed: May 27, 2022

(65) Prior Publication Data

US 2023/0002930 A1      Jan. 5, 2023

(30) Foreign Application Priority Data

May 27, 2021     (CN) ......................... 202110584610.0

(51) Int. Cl.
| | |
|---|---|
| *C30B 29/34* | (2006.01) |
| *C30B 33/02* | (2006.01) |
| *H10K 85/30* | (2023.01) |

(52) U.S. Cl.
CPC .............. *C30B 29/34* (2013.01); *C30B 33/02* (2013.01); *H10K 85/351* (2023.02)

(58) Field of Classification Search
CPC ........ C30B 29/34; C30B 33/02; H10K 85/351
(Continued)

(56) References Cited

FOREIGN PATENT DOCUMENTS

CN          107541781  A  *  1/2018

OTHER PUBLICATIONS

CN-107541781-A English translation (Year: 2018).*
(Continued)

*Primary Examiner* — Anita Nassiri-Motlagh
(74) *Attorney, Agent, or Firm* — MH2 Technology Law Group, LLP

(57) ABSTRACT

The present disclosure provides a growth method of a high-temperature phase lanthanum borosilicate crystal, where the high-temperature phase lanthanum borosilicate crystal is a $\beta$-$La_{1-y}Ln_yBSiO_5$ crystal prepared by a high-temperature flux method; a composite flux system is ($La_{1-y}Ln_y$)$BO_3$—$LiMoO_4$—$SiO_2$—$B_2O_3$, and ($La_{1-y}Ln_y$)$BO_3$, $LiMoO_4$, $SiO_2$, and $B_2O_3$ in the system have molar percentages of $x_1$, $x_2$, $x_3$, and $x_4$, respectively; $0<x_1<0.3$, $0.7\leq x_2<1$, $0<x_3<0.3$, $x_1+x_2+x_3=1$, $x_1:x_4=2:1$ to 4:1. In the present disclosure, a difficulty is overcome in the crystal growth of $\beta$-$LaBSiO_5$ due to phase transition. The crystal is an optical function material that does not undergo the phase transition during annealing and can exist stably at room temperature. The crystal is widely used in laser, terahertz, and other fields.

5 Claims, 11 Drawing Sheets

(58) Field of Classification Search

USPC ................................................... 252/301.4 F

See application file for complete search history.

(56) References Cited

OTHER PUBLICATIONS

Wang et al., "Novel red phosphors LaBSiO5 co-doped with Eu3+, Al3+ for near-UV light-emitting diodes", Optical Materials 37 (2014) 277-280. (Year: 2014).*

* cited by examiner

β-LaBSiO$_5$          β-La$_{1-y}$Ln$_y$BSiO$_5$

GROWTH METHOD OF HIGH-TEMPERATURE PHASE LANTHANUM BOROSILICATE CRYSTAL AND USE

CROSS REFERENCE TO RELATED APPLICATION

This patent application claims the benefit and priority of Chinese Patent Application No. 202110584610.0, filed on May 27, 2021, the disclosure of which is incorporated by reference herein in its entirety as part of the present application.

TECHNICAL FIELD

The present disclosure relates to the field of photoelectric functional materials, in particular to a growth method of a high-temperature phase lanthanum borosilicate crystal and uses thereof.

BACKGROUND ART $LaBSiO_5$ is a novel photofunctional crystal of rare earth-based composite salts, with structural properties of borates and silicates, and has potential research values in ferroelectric, piezoelectric, nonlinear and laser fields. High-temperature phase-based $LaBSiO_5$ is unstable at room temperature and undergoes a transition from a high-temperature phase ($\beta$-$LaBSiO_5$) to a low-temperature phase ($\alpha$-$LaBSiO_5$) when annealed to 412 K. The transition is accompanied by severe stress release, leading to a difficulty in growth of a large-scale and high-temperature phase $LaBSiO_5$ single crystal, which severely limits basic researches and performance development of the single crystal.

Leonyuk et al. grew a $LaBSiO_5$ crystal with a maximum size of 2 mm using toxic $K_2Mo_3O_{10}$—KF as a flux system. For the first time, Li et al. explored a nontoxic composite flux system $LaBO_3$—$Li_2MoO_4$—$SiO_2$ and grown a LaB$SiO_5$ single crystal with a size of 12 $mm^3 \times 10$ $mm^3 \times 8$ $mm^3$. However, due to phase transition, the crystal cannot maintain ideal single crystal morphology at room temperature, and is easy to crack caused by a poor crystal quality. Shang et al. grew a millimeter-scale $LaBSiO_5$ single crystal using $Li_2MoO_4$ as a flux, and systematically studied nonlinear optical effects and ferroelectric effects of the single crystal. In summary, currently the $LaBSiO_5$ crystal has: (1) extremely low crystal size; (2) difficulty in obtaining a high temperature phase due to phase transition. These defects make the $LaBSiO_5$ crystal limited in the development of macroscopic properties and the use in photoelectric devices.

SUMMARY

To solve the above problems, the present disclosure provides a growth method of a high-temperature phase lanthanum borosilicate crystal.

The present disclosure adopts the following technical solutions.

The present disclosure provides a growth method of a high-temperature phase lanthanum borosilicate crystal, where the high-temperature phase lanthanum borosilicate crystal may be a $\beta$-$La_{1-y}Ln_yBSiO_5$ crystal prepared by a high-temperature flux method; a composite flux system may be $(La_{1-y}Ln_y)BO_3$—$LiMoO_4$—$SiO_2$—$B_2O_3$, and $(La_{1-y}Ln_y)$ $BO_3$, $LiMoO_4$, $SiO_2$, and $B_2O_3$ in the system may have molar percentages of $x_1$, $x_2$, $x_3$, and $x_4$, respectively; $0 < x_1 < 0.3$, $0.7 \le x_2 < 1$, $0 < x_3 < 0.3$, $x_1 + x_2 + x_3 = 1$, $x_1 : x_4 = 2 : 1$ to $4 : 1$.

In at least one embodiment, phase transition of the $\beta$-$La_{1-y}$ $Ln_yBSiO_5$ crystal may be suppressed by controlling a microscopic crystal structure of $LaBSiO_5$ through a doping ion $Ln^{3+}$; and the doping ion $Ln^{3+}$ may be one or more rare earth ions selected from the group consisting of $Eu^{3+}$, $Nd^{3+}$, $Y^{3+}$, $Yb^{3+}$, $Dy^{3+}$, $Lu^{3+}$, $Tb^{3+}$, $Sm^{3+}$, $Tm^{3+}$, $Er^{3+}$, $Gd^{3+}$, $Ho^{3+}$, $Ce^{3+}$, $Pr^{3+}$, and $Sc^{3+}$.

In at least one embodiment, the doping ion $Ln^{3+}$ may have a doping concentration of y, $0.02 \le y \le 0.25$; and the $\beta$-$La_{1-y}$ $Ln_yBSiO_5$ crystal may be stabilized to room temperature without the phase transition.

In at least one embodiment, $(La_{1-y}Ln_y)BO_3$ may have a raw material including $La_2O_3$, $Ln_2O_3$, $H_3BO_3$, and $Li_2CO_3$; $LiMoO_4$ may have a raw material including $Li_2CO_3$ and $MoO_3$; and $B_2O_3$ may have a raw material of $H_3BO_3$.

In at least one embodiment, the $\beta$-$La_{1-y}Ln_yBSiO_5$ crystal may have a trigonal system structure, a space group of $P3_121$, and a unit cell parameters a=b; $\alpha=\beta=90°$, $\gamma=120°$, Z=3.

In at least one embodiment, when Ln is equal to Eu and y is 0.1, a and b each may be 6.8697 Å, and c may be 6.7099 Å.

In at least one embodiment, when Ln is equal to Nd and y is 0.1, a and b each may be 6.8769 Å, and c may be 6.7204 Å.

In at least one embodiment, a crystal structure of the $\beta$-$La_{1-y}Ln_yBSiO_5$ crystal may include B—O groups, Si—O groups, and La—O groups; the B—O groups may form a helical chain that extends along a c-axis by sharing oxygen atoms, and the La—O groups may also form a helical chain that extends along the c-axis by sharing oxygen atoms; two B—O bonds in a B—O polyhedron may be cleaved, and two O atoms bonded to B atoms may be statistically distributed, resulting in local disordering permutation.

In at least one embodiment, crystal growth may be conducted at 700° C. to 1100° C., with a cooling rate of 0.5° C./d to 600° C./d; after the crystal growth is completed, an annealing rate may be 240° C./d to 800° C./d; and the $\beta$-$La_{1-y}Ln_yBSiO_5$ crystal may be grown with seed crystals at a crystal rotation rate of 5 rpm to 20 rpm.

The present disclosure further provides use of a $\beta$-$La_{1-y}$ $Ln_yBSiO_5$ crystal prepared by the growth method of a high-temperature phase lanthanum borosilicate crystal as an optical function material in a solid optical device.

After adopting the above technical solutions, the present disclosure has the following advantages compared with the background art:

In the present disclosure, the phase transition of $LaBSiO_5$ is regulated by means of ion doping with the non-toxic and environmental-friendly composite flux system $(La_{1-y}Ln_y)$ $BO_3$—$LiMoO_4$—$SiO_2$—$B_2O_3$ using the high-temperature flux method, to obtain a large-size $\beta$-$La_{1-y}Ln_yBSiO_5$ crystal. The present disclosure solves the problem that the $\beta$-$LaB$SiO_5$ crystal is difficult to grow due to the phase transition, and endows the $\beta$-$LaBSiO_5$ crystal with fluorescence properties, thereby providing key technical conditions for basic research and use of the crystal. In the present disclosure, the crystal has structural characteristics of stillwellite, with macroscopic symmetry belonging to the $P3_121$ space group, does not undergo phase transition during the annealing, and can exist stably at room temperature. As an optical functional material, the crystal is widely used in laser, terahertz and other fields.

DETAILED DESCRIPTION OF THE EMBODIMENTS

Figure 1:
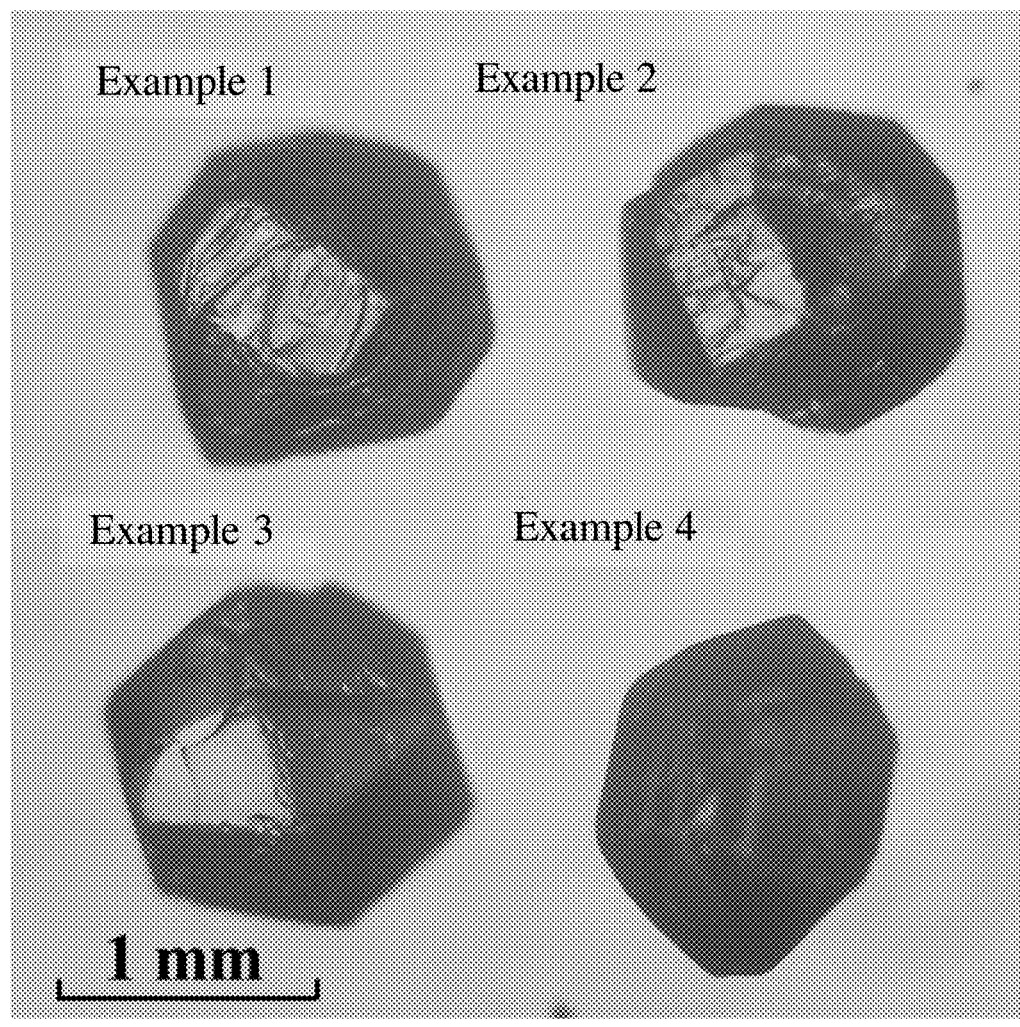
FIG. 1 shows a micrograph of crystals $\beta$-$La_{0.92}Eu_{0.08}BSiO_5$, $\beta$-$La_{0.9}Nd_{0.1}BSiO_5$, $\beta$-$La_{0.8}Nd_{0.2}BSiO_5$, and $\beta$-$La_{0.85}Y_{0.15}BSiO_5$ grown in Examples 1 to 4.
Figure 2:
FIG. 2 shows a photograph of a $\beta$-$La_{0.9}Nd_{0.1}BSiO_5$ crystal grown in Example 5.
Figure 3:
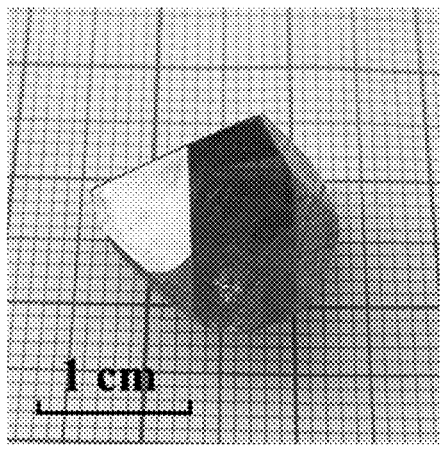
FIG. 3 shows a photograph of a $\beta$-$La_{0.8}Nd_{0.2}BSiO_5$ crystal grown in Example 6.
Figure 4:
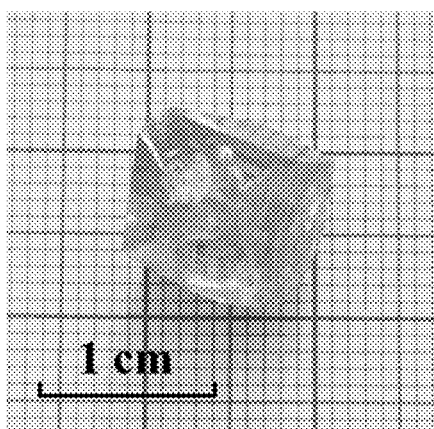
FIG. 4 shows a photograph of a $\beta$-$La_{0.82}Y_{0.15}Nd_{0.03}BSiO_5$ crystal grown in Example 7.
Figure 5:
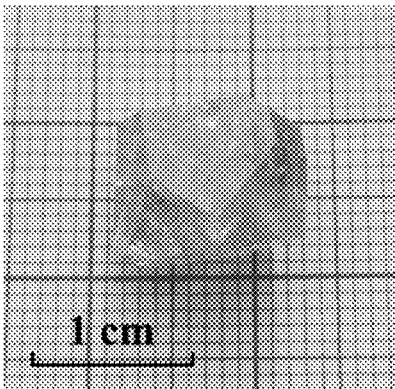
FIG. 5 shows a photograph of a $\beta$-$La_{0.8}Y_{0.15}Nd_{0.05}BSiO_5$ crystal grown in Example 8.
Figure 6:
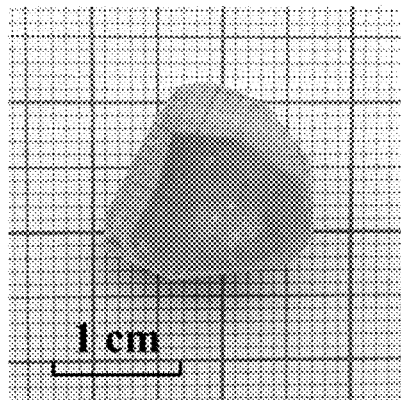
FIG. 6 shows a photograph of a $\beta$-$La_{0.85}Eu_{0.1}Nd_{0.05}BSiO_5$ crystal grown in Example 9.
Figure 7:
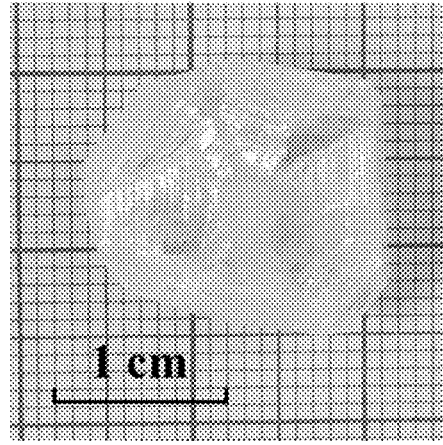
FIG. 7 shows a photograph of a $\beta$-$La_{0.85}Eu_{0.1}Dy_{0.05}BSiO_5$ crystal grown in Example 10.
Figure 8:
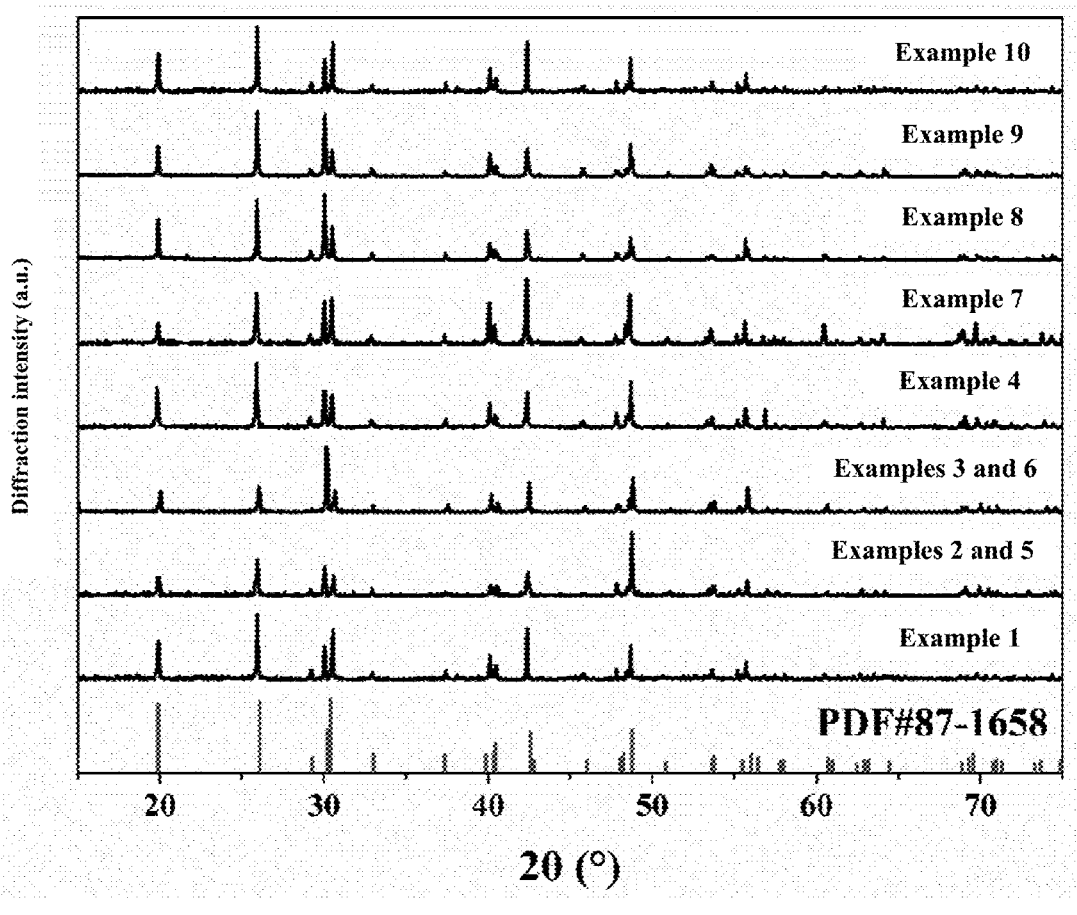
FIG. 8 shows an X-ray diffraction (XRD) pattern of the $\beta$-$La_{1-y}Ln_yBSiO_5$ crystals grown in Example 1 to 10.
Figure 9:
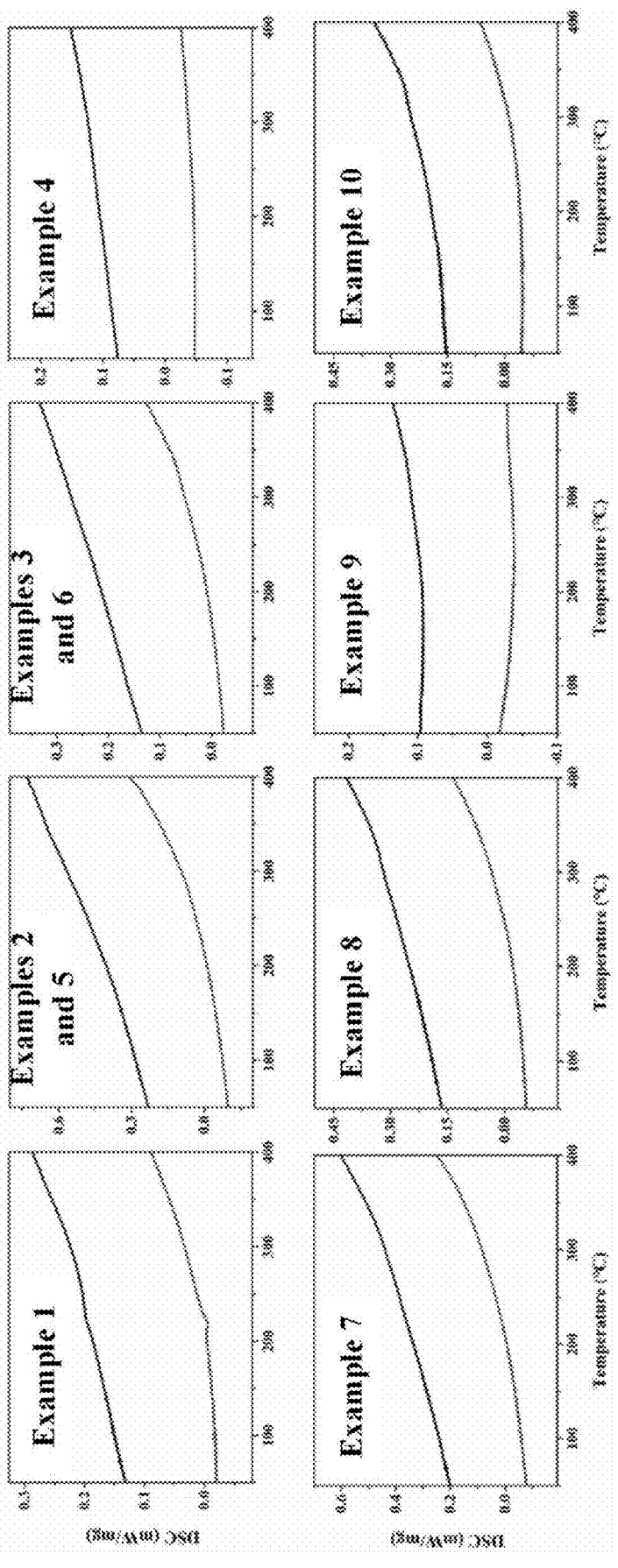
FIG. 9 shows a differential scanning calorimetry (DSC) pattern of the $\beta$-$La_{1-y}Ln_yBSiO_5$ crystals grown in Example 1 to 10.
Figure 10:
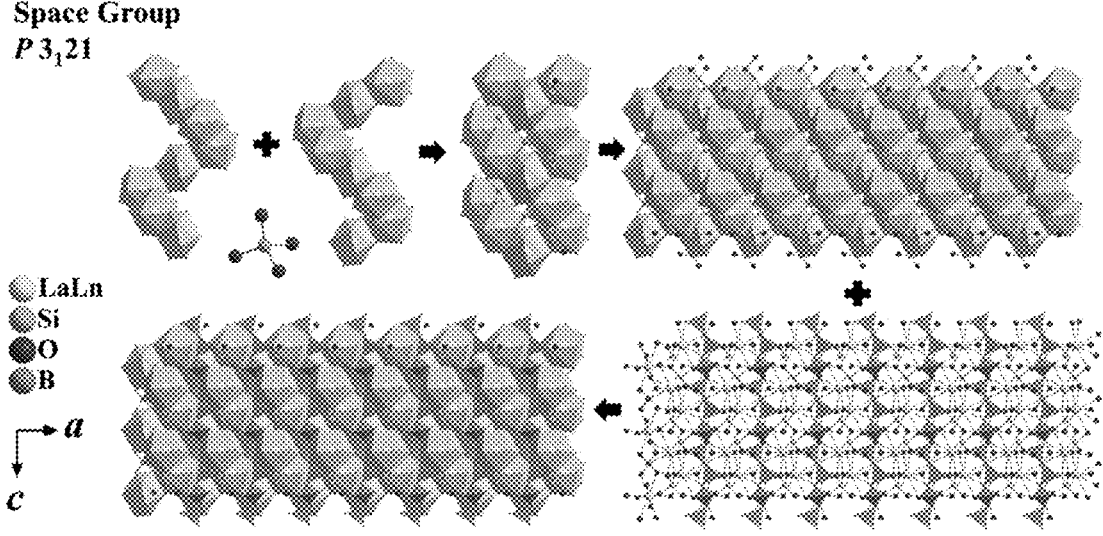
FIG. 10 shows crystal structures of the $\beta$-$La_{1-y}Ln_yBSiO_5$ crystals grown in Example 1 to 10.
Figure 11:
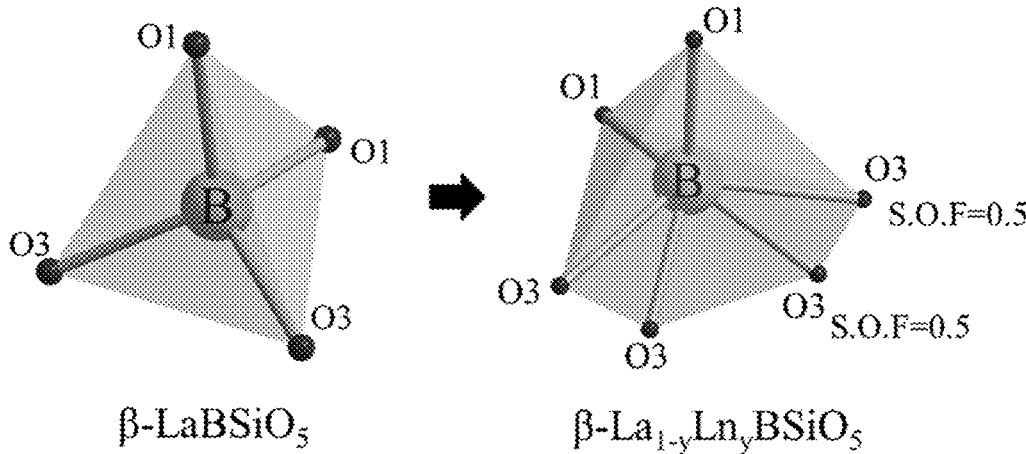
FIG. 11 shows a schematic diagram of B—O bond cleavage of the $\beta$-$La_{1-y}Ln_yBSiO_5$ crystals grown in Example 1 to 10.
Figure 12:
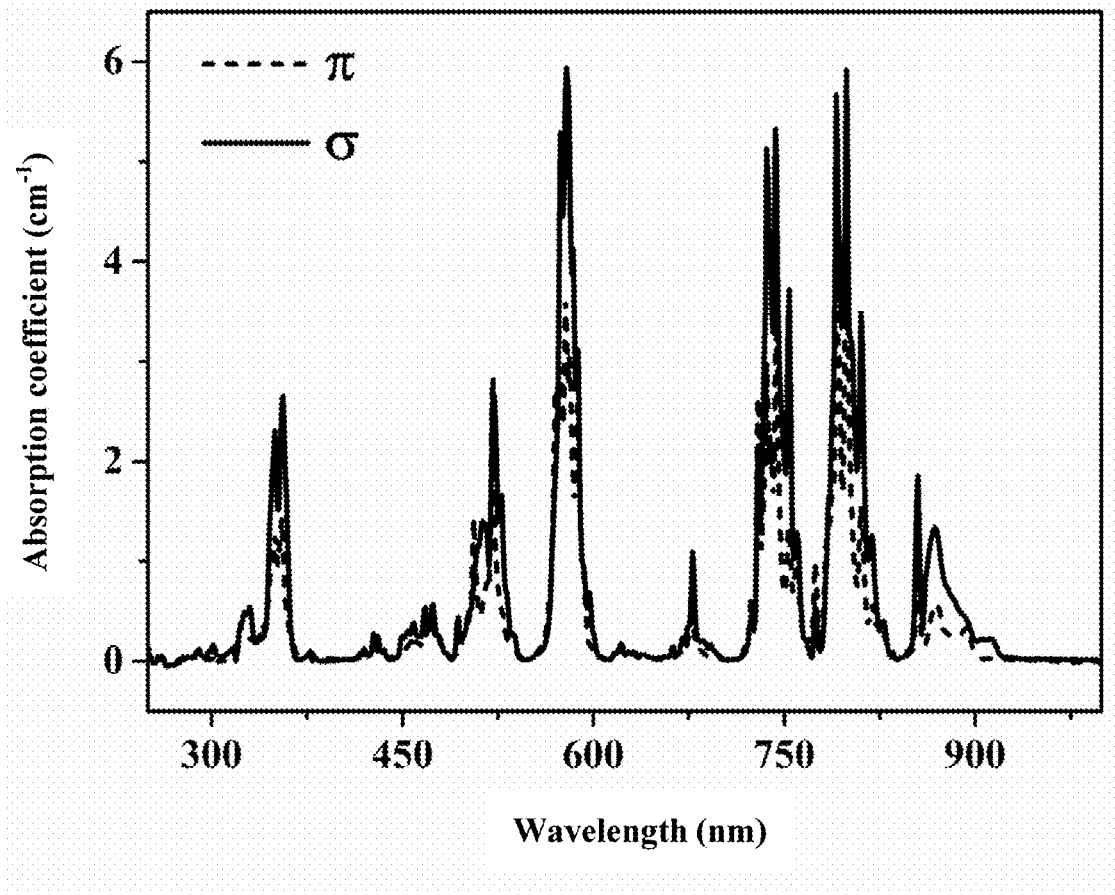
FIG. 12 shows a polarized absorption spectrum of the $\beta$-$La_{0.9}Nd_{0.1}BSiO_5$ crystal grown in Example 5.
Figure 13:
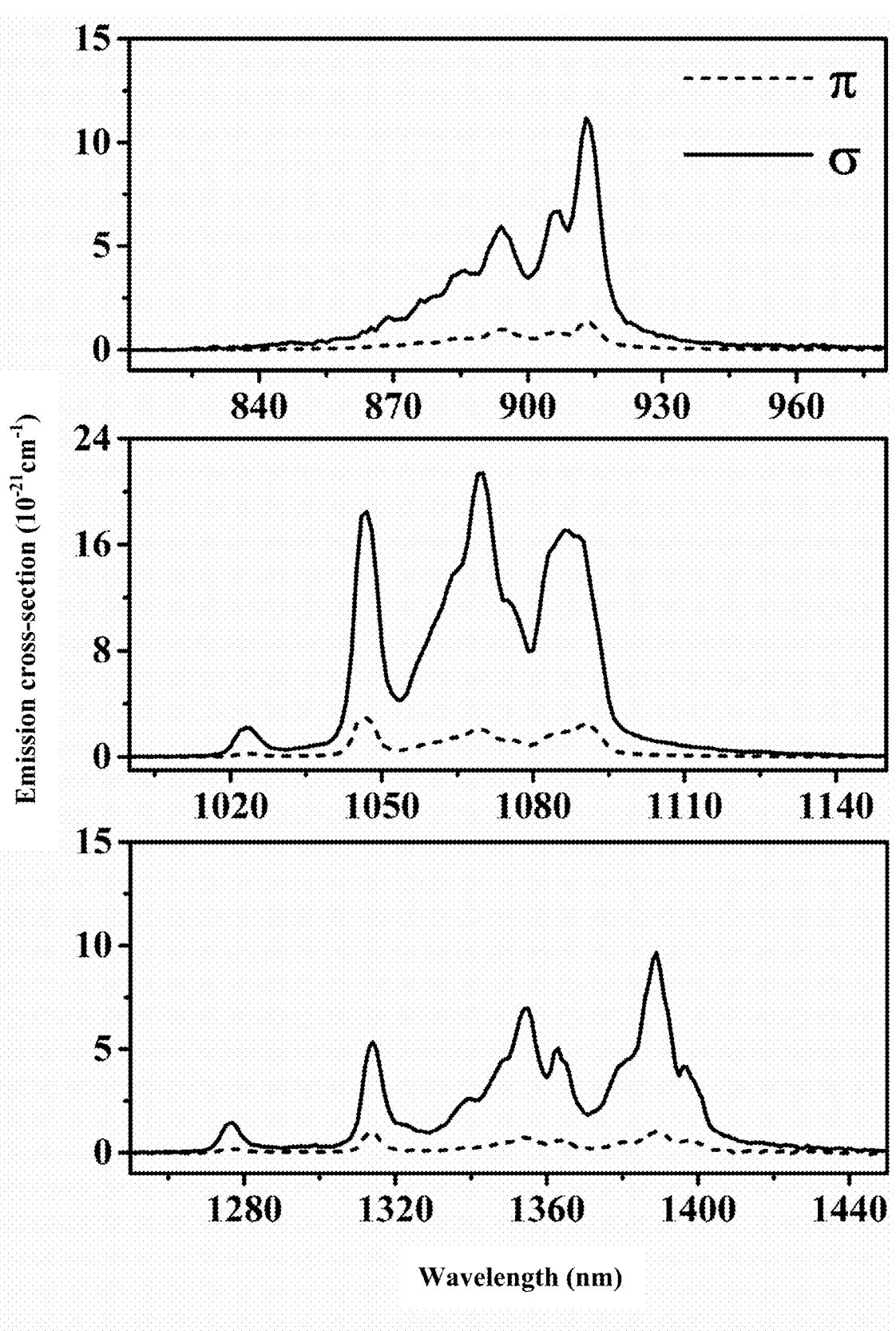
FIG. 13 shows a polarized fluorescence spectrum of the $\beta$-$La_{0.9}Nd_{0.1}BSiO_5$ crystal grown in Example 5.
Figure 14:
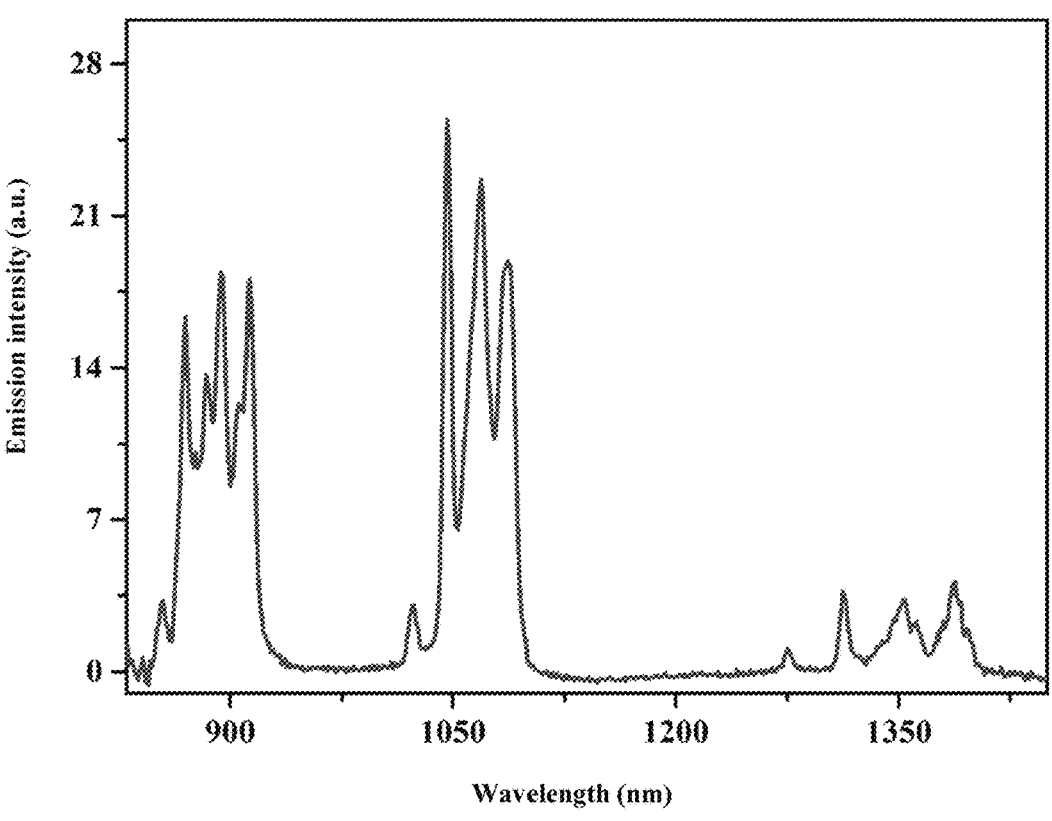
FIG. 14 shows a fluorescence spectrum of the $\beta$-$La_{0.8}Y_{0.15}Nd_{0.05}BSiO_5$ crystal grown in Example 8.
Figure 15:
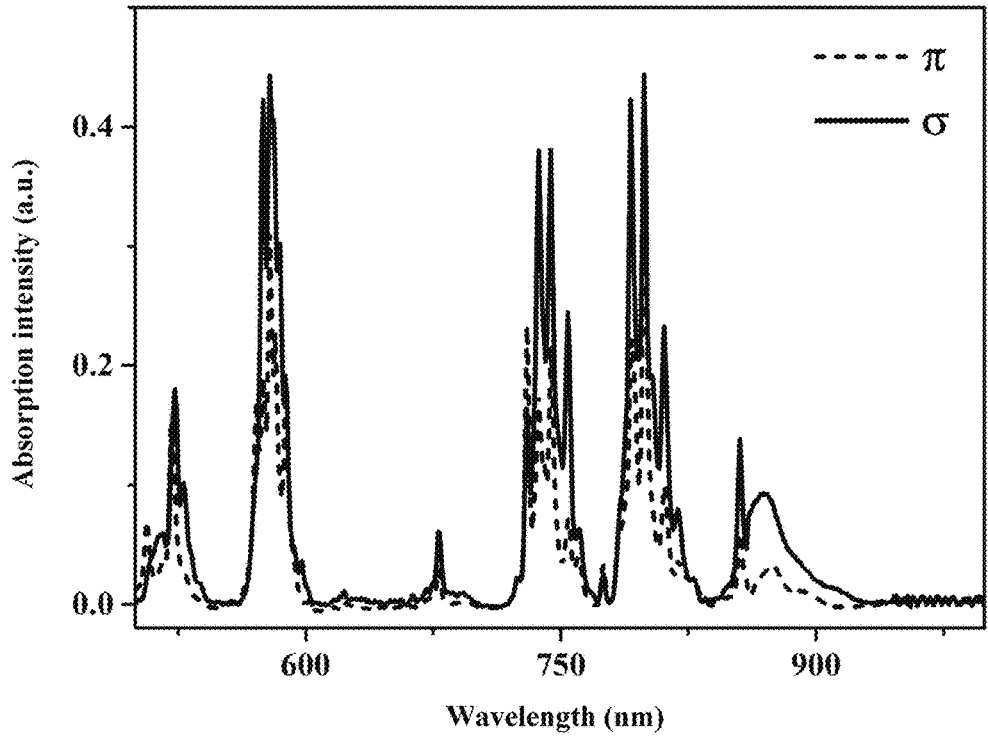
FIG. 15 shows a polarized absorption spectrum of the $\beta$-$La_{0.85}Eu_{0.1}Nd_{0.05}BSiO_5$ crystal grown in Example 9.
Figure 16:
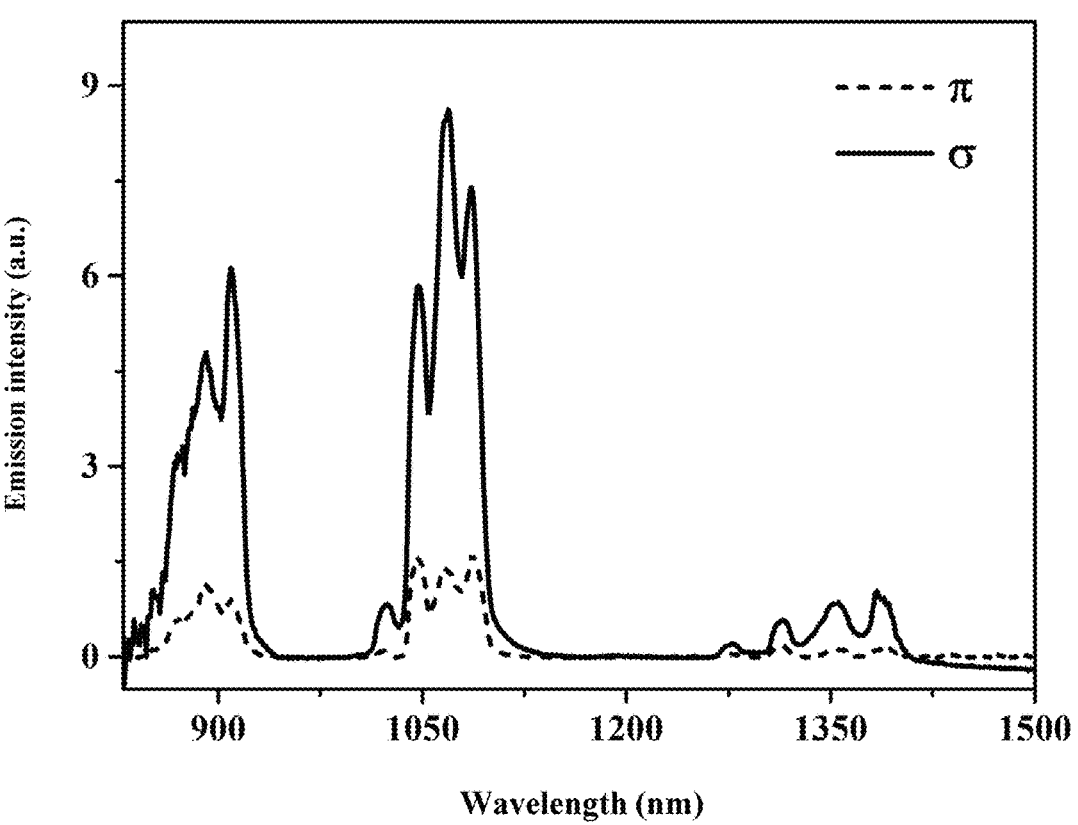
FIG. 16 shows a polarized fluorescence spectrum of the $\beta$-$La_{0.85}Eu_{0.1}Nd_{0.05}BSiO_5$ crystal grown in Example 9.
Figure 17:
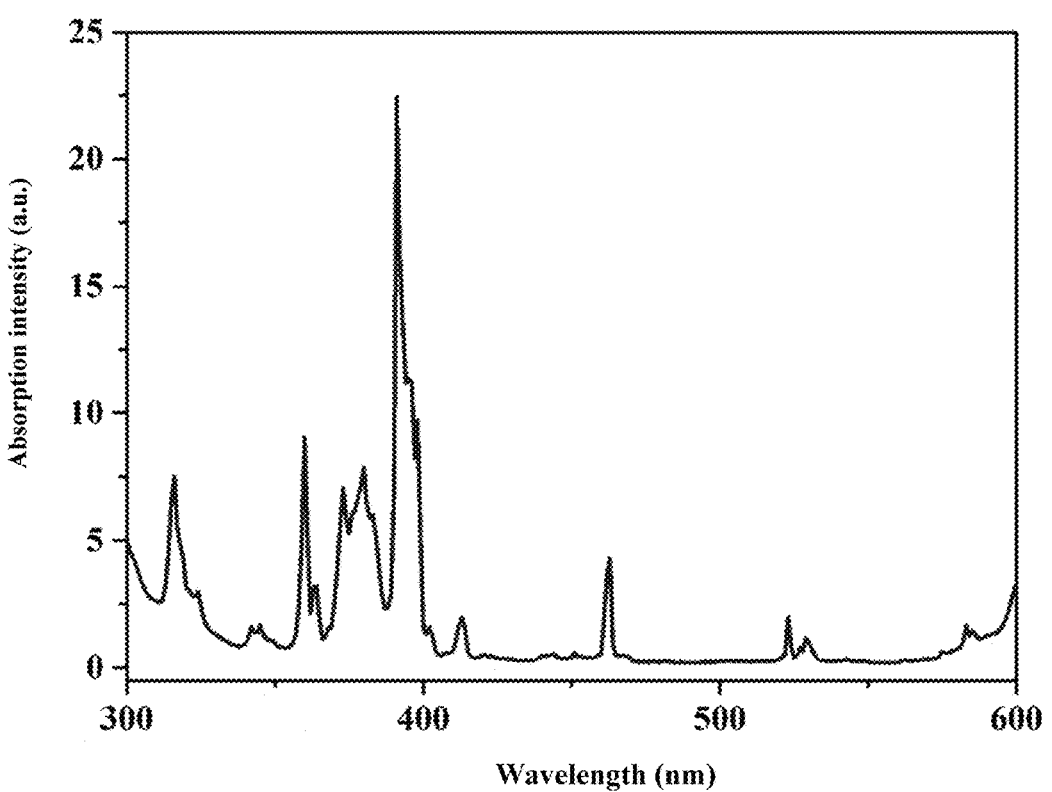
FIG. 17 shows an excitation spectrum of the $\beta$-$La_{0.85}Eu_{0.1}Dy_{0.05}BSiO_5$ crystal grown in Example 10.
Figure 18:
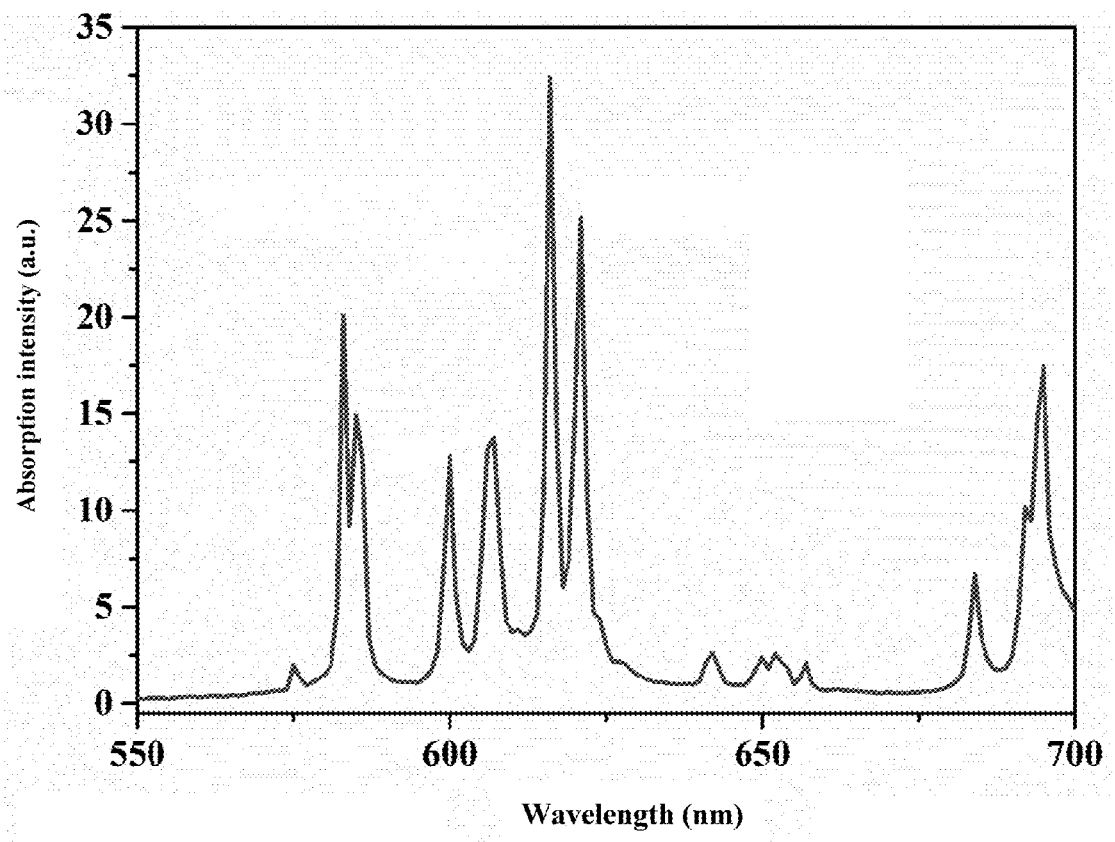
FIG. 18 shows a fluorescence spectrum of the $\beta$-$La_{0.85}Eu_{0.1}Dy_{0.05}BSiO_5$ crystal grown in Example 10.

To make the objectives, technical solutions, and advantages of the present disclosure clearer, the following further describes the present disclosure in detail with reference to the accompanying drawings and embodiments. It should be understood that the specific embodiments described herein are merely intended to illustrate the present disclosure and are not intended to limit the present disclosure.

Example 1 Spontaneous Nucleation Growth of $\beta$-$La_{0.92}Eu_{0.08}BSiO_5$ Crystal 20 g in total of raw materials including $La_2O_3$, $Eu_2O_3$, $H_3BO_3$, $SiO_2$, $Li_2CO_3$, and $MoO_3$ were weighed according to a ratio of $(La_{0.92}Eu_{0.08})BO_3$:$LiMoO_4$:$SiO_2$:$B_2O_3$ at 0.2:0.75:0.05:0.05 (mol), fully ground and mixed in an agate mortar and put into a platinum crucible; an obtained mixture was transferred to a high-temperature molten salt furnace, heated to 1,050° C. in an air atmosphere to melt the raw materials completely, and held for 24 h to make a melt reaction complete; a reaction product was cooled to 800° C.

at 120° C./d, and rapidly annealed to room temperature after crystal growth was completed; a crystal was collected, washed and dried to obtain a transparent $\beta$-$La_{0.92}Eu_{0.08}BSiO_5$ single crystal with a size of about 1.5 mm; the single crystal was determined to be a high temperature phase by X-ray diffraction.

Example 2 Spontaneous Nucleation Growth of $\beta$-$La_{0.9}Nd_{0.1}BSiO_5$ Crystal 30 g in total of raw materials including $La_2O_3$, $Nd_2O_3$, $H_3BO_3$, $SiO_2$, $Li_2CO_3$, and $MoO_3$ were weighed according to a ratio of $(La_{0.9}Nd_{0.1})BO_3$:$LiMoO_4$:$SiO_2$:$B_2O_3$ at 0.1:0.8:0.1:0.025 (mol), fully ground and mixed in an agate mortar and put into a platinum crucible; an obtained mixture was transferred to a high-temperature molten salt furnace, heated to 1,050° C. in an air atmosphere to melt the raw materials completely, and held for 12 h to make a melt reaction complete; a reaction product was cooled to 750° C. at 240° C./d, and rapidly annealed to room temperature after crystal growth was completed; a crystal was collected, washed and dried to obtain a transparent $\beta$-$La_{0.9}Nd_{0.1}BSiO_5$ single crystal with a size of about 1.6 mm; the single crystal was determined to be a high temperature phase by X-ray diffraction.

Example 3 Spontaneous Nucleation Growth of $\beta$-$La_{0.8}Nd_{0.2}BSiO_5$ Crystal 25 g in total of raw materials including $La_2O_3$, $Nd_2O_3$, $H_3BO_3$, $SiO_2$, $Li_2CO_3$, and $MoO_3$ were weighed according to a ratio of $(La_{0.8}Nd_{0.2})BO_3$:$LiMoO_4$:$SiO_2$:$B_2O_3$ at 0.22:0.7:0.08:0.055 (mol), fully ground and mixed in an agate mortar and put into a platinum crucible; an obtained mixture was transferred to a high-temperature molten salt furnace, heated to 1,050° C. in an air atmosphere to melt the raw materials completely, and held for 15 h to make a melt reaction complete; a reaction product was cooled to 850° C. at 360° C./d, and rapidly annealed to room temperature after crystal growth was completed; a crystal was collected, washed and dried to obtain a transparent $\beta$-$La_{0.8}Nd_{0.2}BSiO_5$ single crystal with a size of about 1.8 mm; the single crystal was determined to be a high temperature phase by X-ray diffraction.

Example 4 Spontaneous Nucleation Growth of $\beta$-$La_{0.85}Y_{0.15}BSiO_5$ Crystal 15 g in total of raw materials including $La_2O_3$, $Y_2O_3$, $H_3BO_3$, $SiO_2$, $Li_2CO_3$, and $MoO_3$ were weighed according to a ratio of $(La_{0.85}Y_{0.15})BO_3$:$LiMoO_4$:$SiO_2$:$B_2O_3$ at 0.18:0.72:0.1:0.045 (mol), fully ground and mixed in an agate mortar and put into a platinum crucible; an obtained mixture was transferred to a high-temperature molten salt furnace, heated to 1,050° C. in an air atmosphere to melt the raw materials completely, and held for 36 h to make a melt reaction complete; a reaction product was cooled to 720° C. at 500° C./d, and rapidly annealed to room temperature after crystal growth was completed; a crystal was collected, washed and dried to obtain a transparent $\beta$-$La_{0.85}Y_{0.15}BSiO_5$ single crystal with a size of about 1.2 mm; the single crystal was determined to be a high temperature phase by X-ray diffraction.

Example 5 Top-Seeded Solution Growth (TSSG) Method-Based Growth of $\beta$-$La_{0.9}Nd_{0.1}BSiO_5$ Crystal 120 g in total of raw materials were weighed according to the ratio of Example 2, melted and kept for 30 h, and crystal growth was conducted by a TSSG method; a rough crystal with a relatively desirable quality was grown using platinum wires as a seed crystal, and the rough crystal was used as a seed crystal and dropped to a point contacting a liquid surface at 1030° C.; and the crystal growth was conducted at 1° C./d and a crystal rotation rate of 8 rpm. After a 29-d growth cycle, the temperature was lowered to 1000° C., a crystal was collected, and annealed at 240° C./d to obtain a β-La$_{0.9}$Nd$_{0.1}$BSiO$_5$ crystal with a size of 1.8 cm$^3$×1.8 cm$^3$× 1.8 cm$^3$; the crystal was determined to be a high temperature phase by X-ray diffraction.

Example 6 TSSG Method-Based Growth of β-La$_{0.8}$Nd$_{0.2}$BSiO$_5$ Crystal 100 g in total of raw materials were weighed according to the ratio of Example 3, melted and kept for 20 h, and crystal growth was conducted by a TSSG method; a rough crystal with a relatively desirable quality was grown using platinum wires as a seed crystal, and the rough crystal was used as a seed crystal and dropped to a point contacting a liquid surface at 990° C.; and the crystal growth was conducted at 0.5° C./d and a crystal rotation rate of 15 rpm. After a 40-d growth cycle, the temperature was lowered to 970° C., a crystal was collected, and annealed at 300° C./d to obtain a β-La$_{0.8}$Nd$_{0.2}$BSiO$_5$ crystal with a size of 2.3 cm$^3$×2.3 cm$^3$×2 cm$^3$; the crystal was determined to be a high temperature phase by X-ray diffraction.

Example 7 TSSG Method-Based Growth of β-La$_{0.82}$Y$_{0.15}$Nd$_{0.03}$BSiO$_5$ Crystal 110 g in total of raw materials including La$_2$O$_3$, Y$_2$O$_3$, Nd$_2$O$_3$, H$_3$BO$_3$, SiO$_2$, Li$_2$CO$_3$, and MoO$_3$ were weighed according to a ratio of (La$_{0.82}$Y$_{0.15}$Nd$_{0.03}$)BO$_3$:LiMoO$_4$: SiO$_2$:B$_2$O$_3$ at 0.15:0.75:0.1:0.0375 (mol), melted and kept for 22 h, and crystal growth was conducted by a TSSG method; a rough crystal with a relatively desirable quality was grown using platinum wires as a seed crystal, and the rough crystal was used as a seed crystal and dropped to a point contacting a liquid surface at 1000° C.; and the crystal growth was conducted at 1.5° C./d and a crystal rotation rate of 6 rpm. After a 29-d growth cycle, the temperature was lowered to 960° C., a crystal was collected, and annealed at 270° C./d to obtain a β-La$_{0.82}$Y$_{0.15}$Nd$_{0.03}$BSiO$_5$ crystal; the crystal was determined to be a high temperature phase by X-ray diffraction.

Example 8 TSSG Method-Based Growth of β-La$_{0.8}$Y$_{0.15}$Nd$_{0.05}$BSiO$_5$ Crystal 125 g in total of raw materials including La$_2$O$_3$, Y$_2$O$_3$, Nd$_2$O$_3$, H$_3$BO$_3$, SiO$_2$, Li$_2$CO$_3$, and MoO$_3$ were weighed according to a ratio of (La$_{0.8}$Y$_{0.15}$Nd$_{0.05}$)BO$_3$:LiMoO$_4$: SiO$_2$:B$_2$O$_3$ at 0.17:0.72:0.11:0.0475 (mol), melted and kept for 32 h, and crystal growth was conducted by a TSSG method; a rough crystal with a relatively desirable quality was grown using platinum wires as a seed crystal, and the rough crystal was used as a seed crystal and dropped to a point contacting a liquid surface at 985° C.; and the crystal growth was conducted at 1° C./d and a crystal rotation rate of 10 rpm. After a 35-d growth cycle, the temperature was lowered to 950° C., a crystal was collected, and annealed at 360° C./d to obtain a β-La$_{0.8}$Y$_{0.15}$Nd$_{0.05}$BSiO$_5$ crystal; the crystal was determined to be a high temperature phase by X-ray diffraction.

Example 9 TSSG Method-Based Growth of β-La$_{0.85}$Eu$_{0.1}$Nd$_{0.05}$BSiO$_5$ Crystal 95 g in total of raw materials including La$_2$O$_3$, Eu$_2$O$_3$, Nd$_2$O$_3$, H$_3$BO$_3$, SiO$_2$, Li$_2$CO$_3$, and MoO$_3$ were weighed according to a ratio of (La$_{0.85}$Eu$_{0.1}$Nd$_{0.05}$)BO$_3$:LiMoO$_4$: SiO$_2$:B$_2$O$_3$ at 0.15:0.76:0.09:0.0375 (mol), melted and kept for 24 h, and crystal growth was conducted by a TSSG method; a rough crystal with a relatively desirable quality was grown using platinum wires as a seed crystal, and the rough crystal was used as a seed crystal and dropped to a point contacting a liquid surface at 1015° C.; and the crystal growth was conducted at 1° C./d and a crystal rotation rate of 15 rpm. After a 37-d growth cycle, the temperature was lowered to 978° C., a crystal was collected, and annealed at 300° C./d to obtain a β-La$_{0.85}$Eu$_{0.1}$Nd$_{0.05}$BSiO$_5$ crystal; the crystal was determined to be a high temperature phase by X-ray diffraction.

Example 10 TSSG Method-Based Growth of β-La$_{0.85}$Eu$_{0.1}$Dy$_{0.05}$BSiO$_5$ Crystal 100 g in total of raw materials including La$_2$O$_3$, Eu$_2$O$_3$, Dy$_2$O$_3$, H$_3$BO$_3$, SiO$_2$, Li$_2$CO$_3$, and MoO$_3$ were weighed according to a ratio of (La$_{0.85}$Eu$_{0.1}$Dy$_{0.05}$)BO$_3$:LiMoO$_4$: SiO$_2$:B$_2$O$_3$ at 0.15:0.7:0.15:0.0375 (mol), melted and kept for 26 h, and crystal growth was conducted by a TSSG method; a rough crystal with a relatively desirable quality was grown using platinum wires as a seed crystal, and the rough crystal was used as a seed crystal and dropped to a point contacting a liquid surface at 1010° C.; and the crystal growth was conducted at 0.5° C./d and a crystal rotation rate of 12 rpm. After a 45-d growth cycle, the temperature was lowered to 987° C., a crystal was collected, and annealed at 240° C./d to obtain a β-La$_{0.85}$Eu$_{0.1}$Dy$_{0.05}$BSiO$_5$ crystal; the crystal was determined to be a high temperature phase by X-ray diffraction.

The above described are merely specific implementations of the present disclosure, and the protection scope of the present disclosure is not limited thereto. Any modification or replacement easily conceived by those skilled in the art within the technical scope of the present disclosure should fall within the protection scope of the present disclosure. Therefore, the protection scope of the present disclosure should be subject to the protection scope of the claims.

What is claimed is:

1. A growth method of a high-temperature phase lanthanum borosilicate crystal, wherein the high-temperature phase lanthanum borosilicate crystal is a β-La$_{1-y}$Ln$_y$BSiO$_5$ crystal prepared by a high-temperature flux method;

a composite flux system is (La$_{1-y}$Ln$_y$)BO$_3$—LiMoO$_4$— SiO$_2$—B$_2$O$_3$, and (La$_{1-y}$Ln$_y$)BO$_3$, LiMoO$_4$, SiO$_2$, and B$_2$O$_3$ in the system have molar percentages of x$_1$, x$_2$, x$_3$, and x$_4$, respectively; 0<x$_1$<0.3, 0.7≤x$_2$<1, 0<x$_3$<0.3, x$_1$+x$_2$+x$_3$=1, x$_1$:x$_4$=2:1 to 4:1, wherein a phase transition of the β-La$_{1-y}$Ln$_y$BSiO$_5$ crystal is suppressed by controlling a microscopic crystal structure of LaBSiO$_5$ through a doping ion Ln$^{3+}$, wherein the doping ion Ln$^{3+}$ has a doping concentration of y, 0.02≤y≤0.25, and wherein the β-La$_{1-y}$Ln$_y$B-SiO$_5$ crystal is stabilized to room temperature without the phase transition;

wherein the β-La$_{1-y}$Ln$_y$BSiO$_5$ crystal has a trigonal system structure, a space group of P3$_1$21, and a unit cell parameters a=b; α=β=90°, γ=120°, Z=3;

wherein the (La$_{1-y}$Ln$_y$)BO$_3$ has a raw material comprising La$_2$O$_3$, Ln$_2$O$_3$, H$_3$BO$_3$, and Li$_2$CO$_3$, and wherein the LiMoO$_4$ has a raw material comprising Li$_2$CO$_3$ and MoO$_3$, and wherein the B$_2$O$_3$ has a raw material of H$_3$BO$_3$; and wherein crystal growth is conducted at 700° C. to 1100° C., with a constant cooling rate, and the constant cooling rate is in a range of 0.5° C./day to 600° C./day, wherein after the crystal growth is completed, an annealing rate is 240° C./day to 800° C./day, and wherein the β-La$_{1-y}$Ln$_y$BSiO$_5$ crystal is grown with seed crystals at a crystal rotation rate of 5 rpm to 20 rpm.

2. The growth method of a high-temperature phase lanthanum borosilicate crystal according to claim 1, wherein the doping ion Ln$^{3+}$ is one or more rare earth ions selected from the group consisting of Eu$^{3+}$, Nd$^{3+}$, Y$^{3+}$, Yb$^{3+}$, Dy$^{3+}$, Lu$^{3+}$, Tb$^{3+}$, Sm$^{3+}$, Tm$^{3+}$, Er$^{3+}$, Gd$^{3+}$, Ho$^{3+}$, Ce$^{3+}$, Pr$^{3+}$, and Sc$^{3+}$.

3. The growth method of a high-temperature phase lanthanum borosilicate crystal according to claim 2, wherein when Ln is equal to Eu and y is 0.1, a and b each are 6.8697 Å, and c is 6.7099 Å.

4. The growth method of a high-temperature phase lanthanum borosilicate crystal according to claim 2, wherein when Ln is equal to Nd and y is 0.1, a and b each are 6.8769 Å, and c is 6.7204 Å.

5. The growth method of a high-temperature phase lanthanum borosilicate crystal according to claim 1, wherein a crystal structure of the β-La$_{1-y}$Ln$_y$BSiO$_5$ crystal comprises B—O groups, Si—O groups, and La—O groups;

the B—O groups form a helical chain that extends along a c-axis by sharing oxygen atoms, and the La—O groups also form a helical chain that extends along the c-axis by sharing oxygen atoms;

two B—O bonds in a B—O polyhedron are cleaved, and two O atoms bonded to B atoms are statistically distributed, resulting in local disordering permutation.

* * * * *